(12) United States Patent
Nawrocki et al.

(10) Patent No.: US 10,509,316 B2
(45) Date of Patent: Dec. 17, 2019

(54) POLYSULFONAMIDE REDISTRIBUTION COMPOSITIONS AND METHODS OF THEIR USE

(71) Applicants: Daniel J Nawrocki, Chicopee, MA (US); Qingzhou Cui, Boston, MA (US); Nao Honda, Tokyo (JP)

(72) Inventors: Daniel J Nawrocki, Chicopee, MA (US); Qingzhou Cui, Boston, MA (US); Nao Honda, Tokyo (JP)

( * ) Notice: Subject to any disclaimer, the term of this patent is extended or adjusted under 35 U.S.C. 154(b) by 0 days.

(21) Appl. No.: 15/591,399

(22) Filed: May 10, 2017

(65) Prior Publication Data

US 2017/0329222 A1 Nov. 16, 2017

Related U.S. Application Data

(60) Provisional application No. 62/335,115, filed on May 12, 2016.

(51) Int. Cl.

| | |
|---|---|
| *G03F 7/004* | (2006.01) |
| *G03F 7/038* | (2006.01) |
| *G03F 7/039* | (2006.01) |
| *G03F 7/16* | (2006.01) |
| *G03F 7/20* | (2006.01) |
| *G03F 7/38* | (2006.01) |
| *G03F 7/32* | (2006.01) |
| *C08G 75/30* | (2006.01) |
| *H01L 21/027* | (2006.01) |
| *H01L 23/00* | (2006.01) |

(52) U.S. Cl.
CPC ............ *G03F 7/038* (2013.01); *C08G 75/30* (2013.01); *G03F 7/0045* (2013.01); *G03F 7/0046* (2013.01); *G03F 7/0048* (2013.01); *G03F 7/039* (2013.01); *G03F 7/164* (2013.01); *G03F 7/168* (2013.01); *G03F 7/2004* (2013.01); *G03F 7/322* (2013.01); *G03F 7/38* (2013.01); *H01L 21/0274* (2013.01); *G03F 7/162* (2013.01); *H01L 24/02* (2013.01); *H01L 2224/02311* (2013.01)

(58) Field of Classification Search
CPC ... G03F 7/04; G03F 7/038; G03F 7/30; G03F 7/40; H01L 21/0274; C08G 75/30; C08L 81/10
USPC ............................. 430/270.1, 330, 322, 331
See application file for complete search history.

(56) References Cited

U.S. PATENT DOCUMENTS

| | | | | |
|---|---|---|---|---|
| 4,107,155 A | * | 8/1978 | Fletcher | ................. C08G 75/30 528/373 |
| 4,865,950 A | * | 9/1989 | DoMinh | ............... G03F 7/0233 257/E23.007 |
| 4,968,586 A | * | 11/1990 | DoMinh | ................. G03F 7/038 430/170 |

FOREIGN PATENT DOCUMENTS

| | | | |
|---|---|---|---|
| JP | 2000331713 A | * 11/2000 | |
| JP | 2017185462 A | * 10/2017 | |
| WO | WO-2006059700 A1 | * 6/2006 | ............. B01J 20/26 |

OTHER PUBLICATIONS

Machine translation of JP 2000-331713 (no date).*
Machine translation of WO 2006-059700 (no date).*

* cited by examiner

*Primary Examiner* — Amanda C Walke
(74) *Attorney, Agent, or Firm* — The Patent Practice of Szmanda & Shelnut LLC; James G. Shelnut

(57) ABSTRACT

The invention relates to polysulfonamide compositions for use as redistribution layers as used in the manufacture of semiconductors and semiconductor packages. More specifically it relates to photoimageable polysulfonamide composition for redistribution applications. The invention also relates to the use of the compositions in semiconductor manufacture.

20 Claims, 3 Drawing Sheets

POLYSULFONAMIDE REDISTRIBUTION COMPOSITIONS AND METHODS OF THEIR USE

FIELD OF INVENTION

The invention relates to polysulfonamide compositions for use as redistribution layers as used in the manufacture of semiconductors and semiconductor packages. More specifically it relates to photoimageable polysulfonamide compositions for redistribution applications. The invention also relates to the use of the compositions in semiconductor manufacture.

BACKGROUND OF THE INVENTION

An integrated circuit (IC) is a set of electronic circuits that are manufactured onto a semiconductor, notably silicon. ICs can be made very compact, having upwards of 10 million transistors or other electronic components per $mm^2$ and growing. As such the width and size of the conducting lines and interconnections used to connect the transistors and other components to the rest of the microcircuit need to be made smaller and smaller as the technology advances, currently tens of nanometers.

In some cases, when an IC, or microchip, is manufactured, electrical connections called leads are attached from the microchip to a package in which the chip resides using wire bonds. The package is then bonded to a circuit board using a number of techniques such as, J-wing, gull-wing and solder bump interconnects. Many layers of materials, both conductive and non-conductive, are required to interconnect the transistors of microchips to packages to circuit boards and the outside world. In these constructions, distribution layers are necessary.

A redistribution layer is an extra layer of wiring on the chip and/or package that enables electronic interconnection of the microchip to other microchips, to the package and/or to the circuit board, and can be many layers of varying thicknesses, and resolutions. Redistribution layers are also used in chip stacking technologies.

For example, redistributing IC bond pads before flip chip bumping has become a common process for interconnection. Bumping is a process using solder which is applied as a solder paste and reflowed to create a round ball, or bump, of solder. Redistribution layers allow solder paste bumping of die originally designed for wire bonding. Wire bonding of the IC provides connections only to the one dimensional periphery of the IC, while redistribution layers and bumping allows the connections to be distributed throughout the two dimensional surface of the IC. While stud bumps and plated bumps could tolerate the small size and close spacing (for example 100 micron square pads on 150 micron pitch) of wire bond pads, solder paste generally requires more than twice that spacing. Converting peripheral wire bond pads to an area array of solder-bump pads by redistribution overcomes that barrier.

In some applications, redistribution offers an attractive method to create distributed power and ground contacts. Redistributed pads also transform off-chip connections from chip scale to board scale, as an alternative to expensive multilayer substrates. Wafer-level chip-scale packages often redistribute to ball-grid array pads as their final external package connection.

More compelling needs have been driving redistribution. Advances in chip scale packaging, wafer-level packaging, and most recently, 3-D packaging and system-in-package, often require redistributed bond pads.

A redistribution layer consists of wiring for electronic interconnect, processed by electroplating, vapor deposition, electroless plating or combinations thereof. Redistribution layers also require materials with low dielectric properties to isolate and insulate the interconnect wiring. As chip and consequently packaging and redistribution layers are pushed to be smaller and smaller, the material properties need to be able to continue to insulate and isolate the interconnects. Also as the dimensions decrease, processing methods needs to address ease of manufacture, cost issues, repeatability, and control.

In many instances polyimide is being used as in distribution layers, as well as organosilicon, benzocyclobutane and other exotic and expensive materials, that each have their own level of complexity, both in synthesis and in processing.

Thus there is a need for improved materials and improved processes that are designed to meet the new and ever demanding integrated circuit technology, particularly in the area of redistribution.

SUMMARY OF EXEMPLARY EMBODIMENTS

Figure 1:
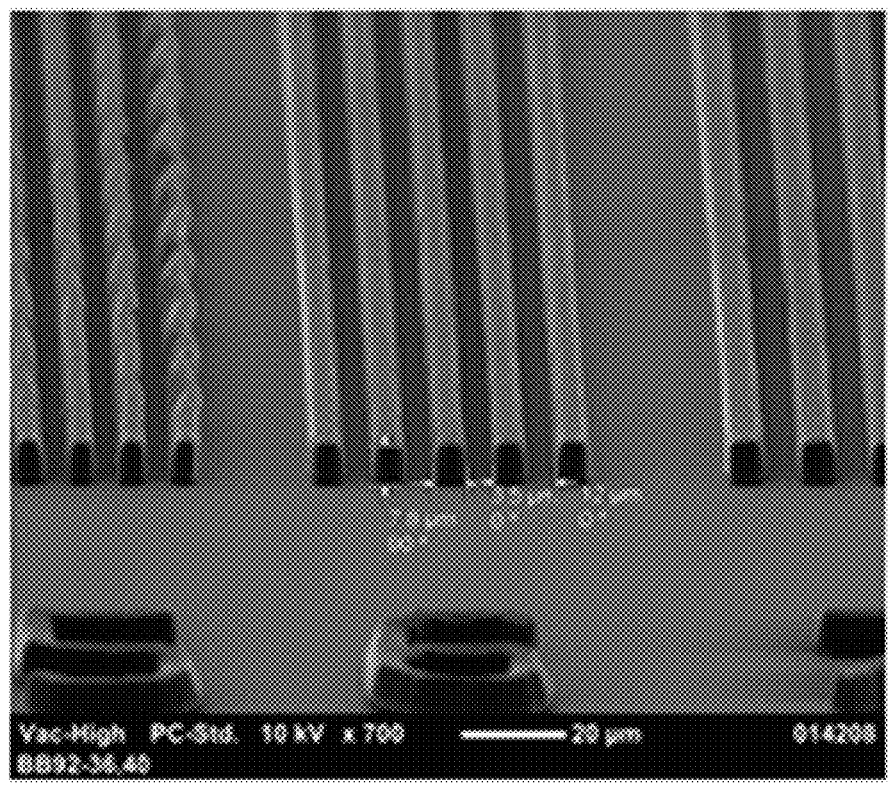
FIG. 1 shows an SEM picture of the results from the composition and processing of example 1.

Disclosed and claimed herein are novel photosensitive compositions for use as low dielectric materials suitable for redistribution layers. Also disclosed and claimed herein are methods of using the novel compositions including ink jet and dry film applications.

On a first embodiment, disclosed and claimed herein are photoimageable compositions comprising at least one first polymeric aryl sulfonamide having formula (1):

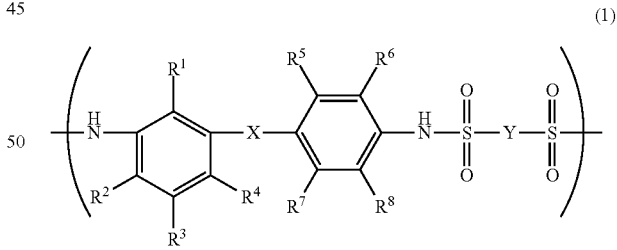

wherein $R^1$ through $R^8$ are the same or different and are hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; Y is an aromatic group or a chain of aromatic groups, X is a chalcogen, pnictogen, oxide of sulfur, oxide of phosphorous, silicon, or oxide of silicon; at least one crosslinking component; at least one photoacid generator, and at least one solvent, wherein the composition has a dielectric constant less than 4.0 when processed.

In a second embodiment, disclosed and claimed herein are composition of the above embodiment wherein Y is formula (2);

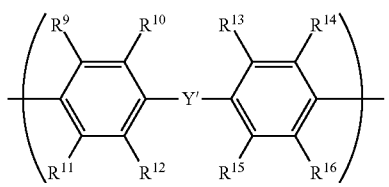

(2)

wherein $R^9$ through $R^{16}$ is the same or different and is hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; and Y' is a chemical bond, a carbonyl group, a chalcogen, pnictogen, oxide of sulfur, oxide of phosphorous, silicon, or oxide of silicon.

In a third embodiment, disclosed and claimed herein are compositions of the above embodiments wherein the first polymeric aromatic sulfonamide has a MW between about 20K and 200K and the composition is soluble in aqueous base, when the composition is coated and dried.

In a fourth embodiment, disclosed and claimed herein are compositions of the above embodiments wherein the compositions further comprise at least one of a flexibilizer, a dissolution rate modifier, an adhesion promoter or a combination thereof.

In a fifth embodiment, disclosed and claimed herein are compositions of the above embodiments wherein the compositions further comprise at least one second polymeric aryl sulfonamide having formula (1), wherein X is a chalcogen, pnictogen, oxide of sulfur, oxide of phosphorous, silicon, or oxide of silicon; Y is formula (2); wherein $R^1$ through $R^{16}$ is the same or different and is hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; and Y' is a chemical bond, a carbonyl group, a chalcogen, pnictogen, oxide of sulfur, oxide of phosphorous, silicon, or oxide of silicon, wherein the at least one second sulfonamide has a solubility in alkaline developer higher than the at least one first polymeric aryl sulfonamide.

In a sixth embodiment, disclosed and claimed herein are compositions of the above embodiments wherein the at least one photoacid generator comprises an onium salt compounds, a sulfone imide compound, a halogen-containing compound, a sulfone compound, a sulfonate ester compound, a quinone-diazide compound, or a diazomethane compounds, or a triphenylsulfonium salt.

In a seventh embodiment, disclosed and claimed herein are compositions of the above embodiments wherein the at least one crosslinker comprises at least one of a glycidyl ether, glycidyl ester, glycidyl amine, a methoxymethyl group, an ethoxy methyl group, a butoxymethyl group, a benzyloxymethyl group, dimethylamino methyl group, diethylamino methyl group, a dibutoxymethyl group, a dimethylol amino methyl group, diethylol amino methyl group, a dibutylol amino methyl group, a morpholino methyl group, acetoxymethyl group, benzyloxy methyl group, formyl group, acetyl group, vinyl group or an isopropenyl group or one or more glycidyl ether groups attached to a novolac resin, a novolac, a polyhydroxystyrene, a polyacrylate, or a maleic anhydride ester-acid polymer.

In an eighth embodiment, disclosed and claimed herein are compositions of the above embodiments wherein the at least one solvent comprises esters, ethers, ether-esters, ketones, keto-esters, hydrocarbons, aromatics, and halogenated solvents.

In a ninth embodiment, disclosed and claimed herein are compositions of the above embodiments wherein the at least one crosslinker comprises an acid sensitive monomer or polymer wherein the acid labile group may be at least one tertiary carbonyl group, one tertiary alkyl carbonate group or one vinyl ether group.

In a tenth embodiment, disclosed and claimed herein are processes for forming a redistribution layer containing the steps of providing a substrate, applying the composition of any one of claims 1-16, to a desired wet thickness, using standard techniques such as spin coating, heating the coated substrate to remove a substantial portion of the solvent to obtain a desired thickness, imagewise exposing the coating to actinic radiation, removing the unexposed areas of the coating, and optionally heating the remaining coating, and optionally heating the imagewise exposed coating prior to removing the unexposed areas of the coating. The unexposed areas may be removed with an aqueous base developer such as tetramethylammonium hydroxide or a suitable organic solvent developer.

In further embodiments the compositions are applied using ink-jet technology or dry film techniques.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein the terms "composition" and "formulation" are used interchangeable and mean the same thing.

As used herein the term solvent means a liquid medium into which one or more of the various components of the formulations are soluble, colloidally suspended, or emulsified.

As used herein the term aliphatic refers to branched or unbranched, saturated or unsaturated, cyclic or polycyclic alkanyl, alkenyl, or alkynyl groups and combinations such as, for example, methyl, ethyl, propyl, isopropyl, n-butyl, sec-butyl, tert-butyl, cyclohexyl, adamantly, and the like. The aforementioned groups may have substituents attached to its chain and/or onto its side groups. They may also contain heteroatom substitution in the chain, such as, for example, a diethylene oxide group which contain an oxygen heteroatom in the chain. Heteroatoms include, for example, oxygen, sulfur, selenium, tellurium, nitrogen, phosphorous, silicon, germanium, boron, aluminum and the transition elements of the periodic table and their derivatives, such as SO, $SO_2$, $S_x$, $SnH_2$, $N_x$, and the like, wherein x can be 2-6.

As used herein the term heterocycle alone or in combination refers to optionally substituted aromatic mono-radicals containing from about 4 to about 22 skeletal ring atoms, wherein one or more of the ring atoms is a heteroatom independently selected from among oxygen, nitrogen, sulfur, phosphorous, silicon, selenium, tellurium, silicon, germanium, boron, aluminum and the transition elements of the periodic table and there derivatives, such as for example, $S_x$, $N_x$, SO, $SO_2$ and $SiO_2$, but not limited to these atoms and the proviso that the ring does not contain two adjacent O or S atoms. Where two or more heteroatoms are present in the ring, in some embodiment, the two or more heteroatoms are the same and in some embodiments, some or all of the two or more heteroatoms are different. The term also includes optionally substituted fused and non-fused heteroaromatic radicals as described above having at least one heteroatom. In some embodiments, bonding to a heteroaromatic group is via a carbon atom of the heterocycle, and in some embodiments via the heteroatom of the ring. The heteroaromatic ring may be substituted on one or more or the carbon atoms or on one or more of the heteroatom when available. A fused heteroaromatic ring may contain between two to 4 fused rings. Heterocycles of the current disclosure include for example, the single ring, pyridyl; the fused rings, carbazolyl, benzimidazolyl, quinolinyl, acridinyl; and non-fused biheteroaryl, bipyridinyl. Further examples include furanyl, thienyl, oxazolyl, phenazinyl, benzofuranyl, benzoxazolyl, benzothiazolyl, benzothiadiazolyl, benzothiphenyl, benzoxadiazolyl, benzotriazolyl, imidazolyl, pyridazyl, pyrmidyl, pyrazinyl, pyrrolyl, pyrazolyl, purinyl, phthalazinyl, pteridinyl, quinolinyl, quinazolinyl, quinoxalinyl, triazolyl, tetrazoyl, thiazolinyl, triazinyl, thiadiazolyl, and he like and their derivatives, such as for example, their oxides.

As used herein the phrase remove a substantial portion of the solvent refers to removing, by heat, at least 92% of the solvent from the composition after it has been heated.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The photoimageable compositions of the current disclosure include at least one first polymeric aryl sulfonamide having formula (1):

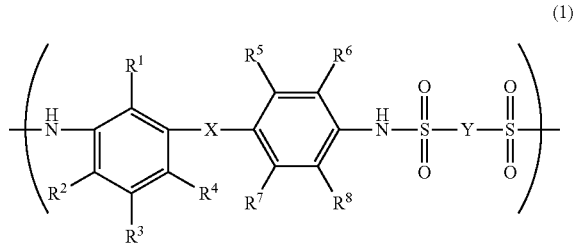

(1)

wherein $R^1$ through $R^8$ are the same or different and are hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; Y is an aromatic group or a chain of aromatic groups, X is a chalcogen, pnictogen, oxide of sulfur, oxide of phosphorous, silicon, or oxide of silicon; at least one crosslinking component; at least one photoacid generator, and at least one solvent, wherein the composition has a dielectric constant less than 4.0 when processed. Y can be formula (2);

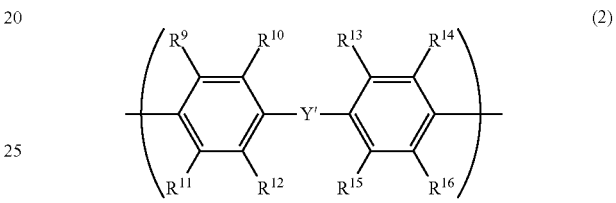

(2)

wherein $R^9$ through $R^{16}$ is the same or different and is hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; and Y' is a chemical bond, a carbonyl group, a chalcogen, pnictogen, oxide of sulfur, oxide of phosphorous, silicon, or oxide of silicon.

The compositions of the current disclosure have a dielectric constant of less than about 4.0 after they are processed into redistribution layers so that the layers can act as insulators for microchip interconnections. Higher dielectric constants of the composition are useful in other areas of microchip fabrication.

In some aspects of the current disclosure the photosensitive compositions exhibit solubility when coated and dried and prior to exposure in aqueous developer compositions, in some cases aqueous base solutions, for example, in tetramethylammonium hydroxide (TMAH) solutions, in concentrations such as 2.38% wt/wt. For example, some compositions are formulated to have a pKa less than about 12.9 when coated and dried, depending on the developer and its strength. Components can be added to the composition to provide for desirable pKa's, either increasing the solvency or decreasing the solvency. In other aspects organic solvents can be used to develop the photosensitive compositions.

The first polymeric aromatic sulfonamide may have a suitable molecular weight between about 20K to 200K Daltons. Again the molecular weight can be altered to provide for targeted properties such as, foe example, solvency in the developer, higher or lower dielectric constant, flexibility, environmental stability and the like.

Photoacid generators (PAGs) useful in the current disclosure include PAGs disclosure well known in the industry and include, without limitation, onium salt compounds, such as sulfonium salts, phosphonium salts or iodonium salts, non-ionic compounds, sulfone imide compounds, halogen-containing compounds, sulfone compounds, oxime sulfonates, ester sulfonate compounds, quinonediazide compounds, diazomethane compounds, dicarboximidyl sulfonic acid esters, ylideneaminooxy sulfonic acid esters, sulfanyldiazomethanes, or a mixture thereof.

Crosslinkers useful for the current disclosure include, but are not limited to, aminoplasts such as monomeric or oligomeric melamines, guanamines, ureas, methylols, monomeric or oligomeric glycolurils, hydroxy alkyl amides, epoxy and epoxy amine resins, blocked isocyanates, and divinyl monomers. Further examples of useful crosslinking compounds are compounds with multiple vinyloxy groups which can act as vinyl ether terminated crosslinking agents. Other useful crosslinkers include epoxy materials such as bisphenol A-based epoxy compounds, bisphenol F-based epoxy compounds, bisphenol S-based epoxy compounds, the novolac resin based epoxy, poly(hydroxystyrene)-based epoxy compounds. Crosslinking polymeric additives may be used alone or in combination with each other depending on the desired properties of the final film. Crosslinking polymers, contain any of a number of the same or different crosslinking substituents, such as, for example, epoxy, hydroxy, thiols, amines, amides, imides, esters, ethers, ureas, carboxylic acids, anhydrides, and the like. Other examples of crosslinking groups include the glycidyl ether group, glycidyl ester group, glycidyl amino group, methoxymethyl group, ethoxy methyl group benzloxymethyl group, dimethylamino methyl group, diethylamino methyl group, dimethylol amino methyl group, diethylol amino methyl group, morpholino methyl group, acetoxymethyl group, benzyloxy methyl group, formyl group, acetyl group, vinyl group, isopropenyl group, and vinyl ether group.

Other useful crosslinkers include monomeric and polymers hydroxyl compounds as well as monomeric and polymeric phenolic or novolac compounds as well as polyacrylates and maleic anhydride ester-acid polymers. The hydroxyl groups may be protected with acid labile protecting groups. The protecting groups are removed from the hydroxyl group when subjected to acid treatment. In the current disclosure PAGs generate acids when exposed to actinic radiation of the proper wavelength. The acid then reacts to deblock the protected hydroxyl which is then free to crosslink into the composition. Acid labile groups are well known in the industry and include, but are not limited to, tertiary alkyl esters, tertiary alkyl carbonyls, t-alkyl carbonates, such as, for example t-butoxy carbonate, and the like.

Solvents useful for the current disclosure include, for example, esters, ethers, ether-esters, ketones, keto-esters, hydrocarbons, aromatics, and halogenated solvents, as well as solvents having one or more polar functional groups such as hydroxyl, ether, amide, ester, ketone, and carbonate, for example, two functional groups, which may be the same or different, such as two hydroxyl groups or one hydroxyl group and one ether group. Selected from the group consisting of polyol, glycol ether, diacetone alcohol, 2-pyrrolidinone, N-methylpyrrolidinone, ethyl lactate, propylene carbonate, 1,3-dimethyl-2-imidazolidindione, and alkyl esters, and any combination thereof.

For example, the polyol is selected from the group consisting of polyethylene glycol, polypropylene glycol, poly(ethylene-co-propylene glycol), polyvinyl alcohol, trimethylol propane, ethylene glycol, glycerin, diethylene glycol, triethylene glycol, tripropylene glycol, tetraethylene glycol, pentaethylene glycol, 1,2-propylene glycol, 1,3-propanediol, butylene glycol, triethylene glycol, 1,2,6-hexanetriol, thiodiglycol, hexylene glycol, bis-2-hydroxyethyl ether, 1,4-butanediol, 1,2-butenediol, 1,4-butenediol, 1,3-butenediol, 1,5-pentanediol, 2,4-pentanediol, 2,4-heptanediol, 1,8-octanediol, 1,10-decanediol, 1,12-dodecanediol, 1,4-cyclohexanediol, 1,4-cyclohexanedimethanol, 1,2-bis(hydroxymethyl)cyclohexane, 1,2-bis(hydroxyethyl)-cyclohexane, 3-methyl-1,5-pentanediol, 2,2,4-trimethyl-1,3-pentanediol, neopentyl glycol, pentaerythritol, sorbitol, mannitol, and any combination thereof, and preferably the polyol is selected from the group consisting of polyethylene glycol, trimethylol propane, ethylene glycol, glycerin, diethylene glycol, tripropylene glycol, and any combination thereof.

A glycol ether selected from the group consisting of ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, propylene glycol n-propyl ether, propylene glycol t-butyl ether, propylene glycol n-butyl ether, dipropylene glycol methyl ether, dipropylene glycol n-propyl ether, dipropylene glycol t-butyl ether, dipropylene glycol n-butyl ether, tripropylene glycol n-propyl ether, tripropylene glycol t-butyl ether, tripropylene glycol n-butyl ether, ethyl cellosolve, methyl cellosolve, polyethylene glycol monomethyl ether, polypropylene glycol monomethyl ether, methoxytriglycol, ethoxytriglycol, butoxytriglycol, 1-butoxyethoxy-2-propanol, and any combination thereof, and preferably, the glycol ether is selected from the group consisting of ethylene glycol monomethyl ether, ethylene glycol monoethyl ether, propylene glycol monomethyl ether, tripropylene glycol monomethyl ether, ethylene glycol monobutyl ether, diethylene glycol monomethyl ether, diethylene glycol monoethyl ether, and any combination thereof In embodiments of the invention, propylene glycol monomethyl ether is a humectant.

Other components of the composition may include, for example, at least one of a flexibilizer, a dissolution rate modifier, leveling agents, surfactants or an adhesion promoter. Flexibilizers include polyols of varying molecular weight, polyesters, polyhydroxy esters and the like. Adhesion promoters are well known in the industry and vary depending on the surface to which the composition is applied. For example, suitable adhesion promotors for a silicon surface are the epoxided silanes. Surfactants and leveling suitable for the current disclosed composition are the fluorinated surfactants as well as others well known in the art.

In some embodiments, dissolution rate modifiers may also be included in the currently disclosed compositions such as to aid in development of the unexposed areas of the coating when processed. They may range from materials with high pKa's, suitable for aqueous base developers, such as, for example, novolac resins, such as cresol-formaldehyde resins, and carboxylic acid containing materials, such as, for example, acrylic acid containing polymers. These modifiers can range in molecular weight from about 100 to about 100,000 Daltons.

In some embodiments dissolution rate inhibitors may be used to prevent the developer from attacking the portions of the coating which are cured. Examples include maleic acid containing polymers and co-polymers and which may be modified to include ester groups.

In other embodiments the dissolution rate modifier may be based on polymeric aryl sulfonamides having formula (1), wherein X is a chalcogen, pnictogen, oxide of sulfur, oxide of phosphorous, silicon, or oxide of silicon; Y is formula (2); wherein $R^1$ through $R^{16}$ is the same or different and is hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; and Y' is a chemical bond, a carbonyl group, a chalcogen, pnictogen, oxide of sulfur, oxide of phosphorous, silicon, or oxide of silicon, wherein the at sulfonamide has a solubility in alkaline developer higher than that of the polymeric aryl sulfonamide used as the base polymer in the composition.

Typical ranges of the components (% wt/wt) of the photoimageable composition include polymeric aryl sulfonamide: 65%-86%, crosslinker: 8.5%-22%, flexibilizer, when present: 4.0%-20.0%, PAG: 0.8%-2.0%, dissolution modifier, when present: 0.8%-2.0%, adhesion promoter, when present: 0.8%-1.5%, and surfactant, when present: 0.04%-0.13%.

In other embodiments disclosed and claimed herein are processes using the currently disclosed photoimageable compositions. Providing a substrate, such as, for example, a silicon wafer, as is, or the wafer may be treated with a number of coatings including adhesion promotors, metal layers, oxide layers and the like. The wafer may also contain prefabricated structures such as other dielectric layers, or metal layers such as for example, copper, aluminum, gold, and the like. The current compositions are then applied to the surface of the substrate and coated using such techniques as spin coating, curtain coating, brush coating, dip coating and the like. The coating may be applied by ink-jet techniques in which case the full surface of the substrate may be coated or only portions of the surface may be coating as desired. In this technique structures as small as about 10 nm may be applied to the surface of the substrate. Coating thicknesses may be between 1-15 microns. Solvent is removed to less than about 92% by heating, such as, for example 90-110° C. for 1-3 minutes.

In other embodiments the compositions of the current disclosure may be first prepared as photoimageable dry film. In preparing the dry film, the composition is coated onto an optically transparent support, from 50 to 95% transparent to the desired actinic radiation being used to expose the photoimage composition, such as for example polyethylene terephthalate (PET) film, using such methods are roller coating or other well-known methods used to prepare dry film photoresists. Solvent is removed to about 92%. A protective polyethylene film is then used to cover the photosensitive composition. In use the polyethylene film is removed and the photoimageable composition side is placed onto the above described substrate generally using heat and pressure. The PET film may be left on and contact exposed or it may be removed for off-contact printing.

Once the substrate has been coated, the photoimageable composition is exposed with actinic radiation in a desired pattern. The radiation may be I-line (365 nm), G-line, H-line, UV, EUV, E-beam, visible or other actinic radiation well known in the art used for photolithography, for example 125 to 800 mJ/cm². The coating may then optionally be heated to improve the curing of the exposed areas. The unexposed areas are then removed using a suitable developer, aqueous or organic solvent, as described above. The developer may be at room temperature or heated. The resulting structure may optionally be heated to increase the cure, for example, 175-250° C. for 1-5 minutes.

EXAMPLES

Example 1

10 parts of the polymeric aryl sulfonamide (3) was added to 100 parts of cyclopentanone. 3.2 parts of Powderlink® 1174 from Eastman Chemical Company, 2.5 parts of CDR 3314 from King Industries, 0.3 parts of para-n-octyloxyphenyl, phenyl iodonium hexafluoroantimonate (OPPI), and 0.3 parts of poly(styrene-co-maleic anhydride) were admixed. The composition was spun coated onto a silicon wafer to 9.8 microns.

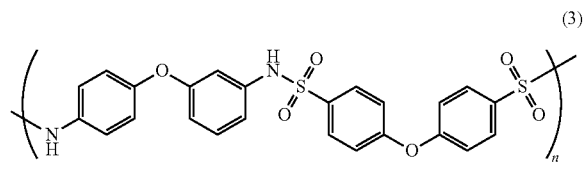

(3)

The coated wafer was soft baked at 90° C. for 2 minutes. The wafer was exposed to 800 mJ/cm² of i-line (365 nm) radiation. The wafer was post exposure baked at 105° C. for 3 minute. The unexposed areas were removed using room temperature 2.38% TMAH solution. The resulting structures were then thermally cured at 175° C. for 1 hr to give the pattern shown in FIG. 1.

Example 2

10 parts of the polymeric aryl sulfonamide (3) was added to a blend of 50 parts of cyclopentanone and 50 parts of 2-heptanone, 1.5 parts of Powderlink® 1174, 1.0 parts of CDR 3314, 0.3 parts of Irgacure® 121, non-ionic oxime sulfonate from BASF, and 0.3 parts of poly(styrene-co-maleic anhydride) were admixed. The composition was spun coated onto a silicon wafer to 9.8 microns.

Figure 2:
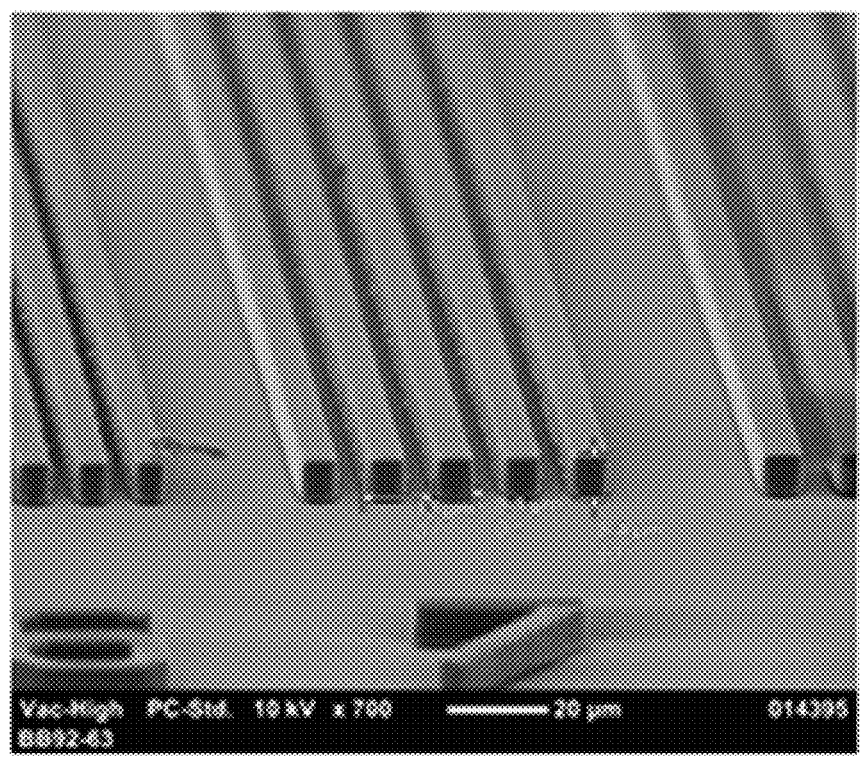
FIG. 2 shows an SEM picture of the results from the composition and processing of example 2.

The coated wafer was soft baked at 90° C. for 2 minutes. The wafer was exposed to 150 mJ/cm² of i-line radiation. The wafer was post exposure baked at 105° C. for 5 minute. The unexposed areas were removed using room temperature 2.38% TMAH solution. The resulting structures were then thermally cured at 175° C. for 1 hour to give the pattern shown in FIG. 2.

Example 3

Figure 3:
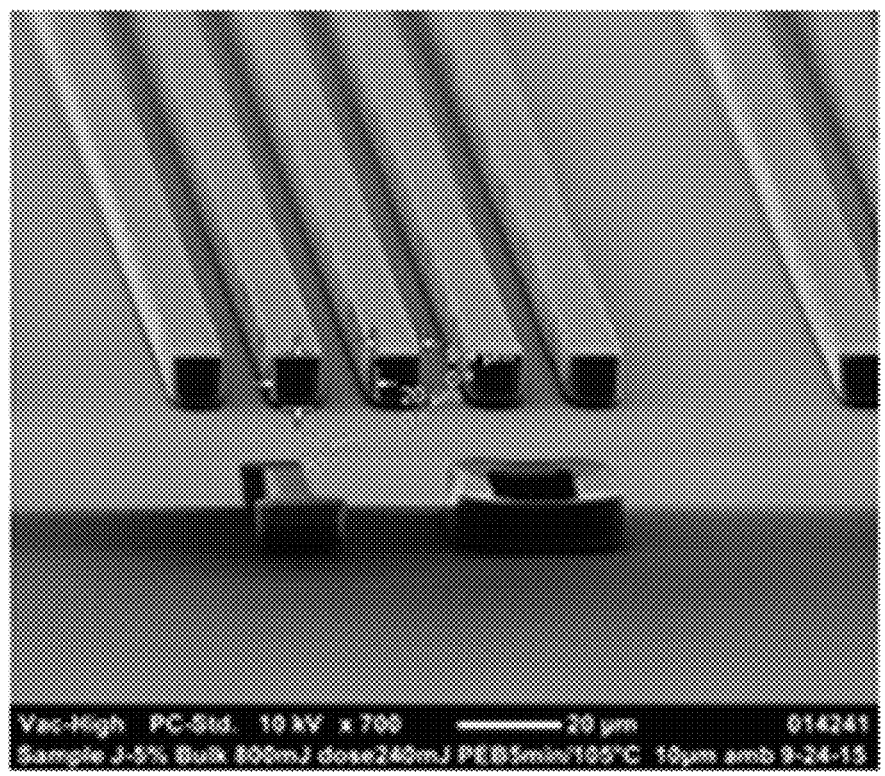
FIG. 3 shows an SEM picture of the results from the composition and processing of example 3.

Example 1 was repeated using Irgacure 103 non-ionic PAG in place of the ionic OPPI PAG. The wafer was processes and exposed to 240 mJ/cm² and post exposure baked at 105° C. for 3 minutes. The results are shown in FIG. 3.

The processed compositions of the examples showed low temperature cure <250° C., aspect ratios of better than 1 in some cases 2.5:1, strong adhesion to copper, which is critical in redistribution layers, as copper is the current ubiquitous metal for interconnections. The processes features also passed environmental testing 1000 cycles of −55° C. to 125° C.

We claim:
1. A photoimageable composition comprising:
   a. At least one first polymeric aryl sulfonamide having the formula (1):

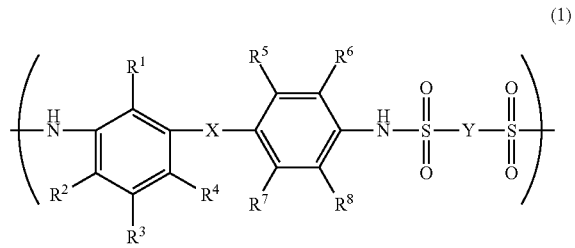

wherein $R^1$ through $R^8$ are the same or different and are hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; Y is an aromatic group or a chain of aromatic groups, X is a chemical bond, a carbonyl group, a chalcogen, pnictogen, oxide of sulfur, oxide of phosphorous, silicon, or oxide of silicon;
   b. At least one crosslinking component,
   c. At least one photoacid generator, and
   d. At least one solvent;
wherein the composition has a dielectric constant less than 4.0 when processed.

2. The composition of claim 1 wherein Y is formula (2);

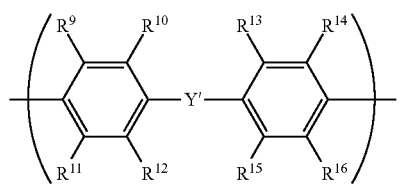

wherein $R^9$ through $R^{16}$ is the same or different and is hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; and Y' is a chemical bond, a carbonyl group, a chalcogen, pnictogen, oxide of sulfur, oxide of phosphorous, silicon, or oxide of silicon.

3. The composition of claim 2, wherein the at least one first polymeric aromatic sulfonamide has a pKa less than about 12.9.

4. The composition of claim 2, wherein the at least one first polymeric aromatic sulfonamide has a MW between about 20K and 200K.

5. The composition of claim 2, wherein the composition is soluble in aqueous base, when the composition is coated and dried.

6. The composition of claim 2, further comprising at least one of a flexibilizer, a dissolution rate modifier, an acid sensitive monomer, oligomer or polymer, or an adhesion promoter.

7. The composition of claim 2, further comprising at least one second polymeric aryl sulfonamide having formula (1), wherein X is a chalcogen, pnictogen, oxide of sulfur, oxide of phosphorous, silicon, or oxide of silicon; Y is formula (2); wherein $R^1$ through $R^{16}$ is the same or different and is hydrogen, branched or unbranched, substituted or unsubstituted alkyl groups of 1-16 carbon atoms with or without one or more heteroatoms substituted into the chain, substituted or unsubstituted aromatic groups, substituted or unsubstituted heteroaromatic group, substituted or unsubstituted fused aromatic or fused heteroaromatic group, substituted or unsubstituted cycloalkyl groups with or without one or more heteroatoms substituted into cyclic ring, halogens, chalcogens, pnictogens, oxides of sulfur, oxides of phosphorous, silicon, and oxides of silicon; and Y' is a chemical bond, a carbonyl group, a chalcogen, pnictogen, oxide of sulfur, oxide of phosphorous, silicon, or oxide of silicon, wherein the at least one second sulfonamide has a solubility in alkaline developer higher than the at least one first polymeric aryl sulfonamide.

8. The composition of claim 1, wherein the at least one photoacid generator comprises an onium salt compounds, a sulfone imide compound, an oxime ester, a halogen-containing compound, a sulfone compound, a sulfonate ester compound, a quinone-diazide compound, or a diazomethane compounds, or at least one photoacid generator comprises a triphenylsulfonium salt.

9. The composition of claim 1, wherein the at least one crosslinker comprises at comprising at least one of a glycidyl ether, glycidyl ester, glycidyl amine, a methoxymethyl group, an ethoxy methyl group, a butoxymethyl group, a benzyloxymethyl group, dimethylamino methyl group, diethylamino methyl group, a dibutoxymethyl group, a dimethylol amino methyl group, diethylol amino methyl group, a dibutylol amino methyl group, a morpholino methyl group, acetoxymethyl group, benzyloxy methyl group, formyl group, acetyl group, vinyl group, an isopropenyl group, or one or more glycidyl ether groups attached to a novolac resin.

10. The composition of claim 1, wherein the at least one solvent comprises esters, ethers, ether-esters, ketones, keto-esters, hydrocarbons, aromatics, and halogenated solvents.

11. The composition of claim 1, further comprising at least one of a novolac, a polyhydroxystyrene, a polyacrylate, or a maleic anhydride ester-acid polymer crosslinking additive.

12. The composition of claim 6, wherein the dissolution rate modifier comprising at least one of a novolac, a polyhydroxystyrene, a polyacrylate, or a maleic anhydride ester-acid polymer additive.

13. The composition of claim 6, wherein the acid sensitive monomer or polymer contains an acid labile group comprises at least one tertiary carbonyl group, one tertiary alkyl carbonate group or one vinyl ether group.

14. A process for forming a redistribution layer comprising the steps of:
   a. providing a substrate,
   b. applying the photoimageable composition of claim 1, to a desired wet thickness, c. heating the coated substrate to remove a substantial portion of the solvent to obtain a desired thickness,
d. imagewise exposing the coating to actinic radiation,
e. removing the unexposed areas of the coating, and
f. optionally heating the remaining coating.

15. The method of claim 14, further comprising the step of heating the imagewise exposed coating prior to removing the unexposed areas of the coating.

16. The method of claim 14, wherein the unexposed areas are removed with an aqueous base developer.

17. The method of claim 16, wherein the base is tetramethylammonium hydroxide.

18. The method of claim 14, wherein the unexposed areas are removed by treating with an organic solvent developer.

19. The method of claim 14, wherein the compositions are applied using ink-jet technology.

20. A photoimagable dry film construction comprising the compositions of claim 1.

* * * * *